United States Patent
Abdelgadir et al.

(10) Patent No.: US 6,727,588 B1
(45) Date of Patent: Apr. 27, 2004

(54) DIFFUSION PREVENTING BARRIER LAYER IN INTEGRATED CIRCUIT INTER-METAL LAYER DIELECTRICS

(75) Inventors: Mahjoub Ali Abdelgadir, Orlando, FL (US); Nace Layadi, Orlando, FL (US); Sailesh Mansinh Merchant, Orlando, FL (US); Vivek Saxena, Orlando, FL (US); Pei H. Yih, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/377,386

(22) Filed: Aug. 19, 1999

(51) Int. Cl.[7] .......................... H01L 23/48; H01L 23/52
(52) U.S. Cl. ...................... 257/751; 257/758
(58) Field of Search .................. 257/751, 753, 257/758, 763

(56) References Cited

U.S. PATENT DOCUMENTS

| | | | |
|---|---|---|---|
| 5,661,334 A | * 8/1997 | Akram | 257/632 |
| 5,763,010 A | * 6/1998 | Guo et al. | 427/376.2 |
| 5,763,937 A | * 6/1998 | Jain et al. | 257/646 |
| 5,859,458 A | * 1/1999 | Hsueh et al. | 257/347 |
| 5,930,655 A | * 7/1999 | Cooney, III et al. | 438/474 |
| 5,946,601 A | * 8/1999 | Wong et al. | 438/783 |
| 6,008,120 A | * 12/1999 | Lee | 438/634 |
| 6,028,013 A | * 2/2000 | Annapragada et al. | 438/783 |
| 6,077,784 A | * 6/2000 | Wu et al. | 438/691 |
| 6,165,915 A | 12/2000 | Jang | 438/787 |
| 6,252,303 B1 | * 6/2001 | Huang | 257/758 |
| 6,277,730 B1 | * 8/2001 | Yuasa et al. | 438/627 |
| 6,340,435 B1 | * 1/2002 | Bjorkman et al. | 216/72 |
| 6,489,213 B1 | * 12/2002 | Hsueh et al. | 438/382 |

FOREIGN PATENT DOCUMENTS

| | | | |
|---|---|---|---|
| EP | 2319 891 A | 6/1998 | H01L/23/532 |
| EP | 1 077 483 A2 | 2/2001 | H01L/21/768 |

OTHER PUBLICATIONS

European Standard Research Report—Dated: Apr. 27, 2001.

* cited by examiner

*Primary Examiner*—Steven Loke
*Assistant Examiner*—Douglas W. Owens

(57) ABSTRACT

A cap or barrier layer that can prevent the migration of impurities in low dielectric constant material, thereby preventing the impurities from attacking conductive elements in subsequent levels of a multi-level integrated circuit structure. The integrated circuit by may be fabricated by disposing the diffusion-preventing barrier layer between a first dielectric layer and the conductive layer at an upper level of the integrated circuit. The diffusion preventing barrier layer may be formed in-situ over the impurity containing dielectric material with the subsequent disposition of a metal layer thereover, and further processing of a multi-layer dielectric structure to include polishing. The in-situ deposition of the cap or barrier layer prevents the exposure of the impurity containing layer to atmosphere, thereby avoiding contamination of the layer by moisture absorption, hydrogen absorption, or the like. In an exemplary embodiment, the diffusion preventing barrier layer is a material containing silicon oxide or silicon rich silicon oxide $SiO_x$, where x is preferably less than 2.

13 Claims, 1 Drawing Sheet

DIFFUSION PREVENTING BARRIER LAYER IN INTEGRATED CIRCUIT INTER-METAL LAYER DIELECTRICS

FIELD OF THE INVENTION

The present invention relates to a diffusion preventing barrier layer in integrated circuit dielectric structures and its method of manufacture.

BACKGROUND OF THE INVENTION

Device scaling and integrated circuit IC miniaturization in general has necessitated the use of low dielectric constants (low-k) materials for the various dielectric layers in a multi-layer integrated circuit structure. With feature sizes of approximately 0.25 microns, the intra-layer or line-to-line capacitance can become the dominant component of parasitic capacitance and can adversely impact the performance of the integrated circuit; while the inter-layer (between two layers in a multi-layer structure) is negligible. As can be appreciated, two metal runners in close proximity of one another in an integrated circuit separated by a dielectric material form a natural capacitor structure, and result in a parasitic capacitance in the integrated circuit. Because the metal runners are formed closer and closer together as IC miniaturization mandates, it is necessary to reduce this capacitance level by reducing the dielectric constant of the dielectric material which forms the dielectric layer of the integrated circuit. One such dielectric material is fluorosilicate glass (FSG). In fabricating FSG, a fluorine-based precursor is often used during the chemical vapor deposition (CVD) process in order to reduce the dielectric constant of the oxide (dielectric) being deposited between the metal runners and forming a particular dielectric layer in a multi-level integrated circuit.

While fluorine precursors reduce the dielectric constant of the dielectric material which in turn reduces intra-layer parasitic capacitance, the presence of fluorine in the form of unbonded or loosely-bounded radicals and ions in the dielectric adversely effects reliability and performance. In particular, fluorine can migrate or diffuse in the dielectric material and attack the metal deposited over the surface of the dielectric. Furthermore, as planarization, often by chemical mechanical polishing (CMP), is used in the fabrication of the VLSI and ULSI structures, the fluorine-doped oxide is often exposed to reactive chemical species during the CMP. This fluorine can readily bond with chemical contaminants, for example hydrogen, which may out-gas during subsequent processing at high temperature. This out-gasing may cause further mechanical reliability problems; for example, delamination of metal or reduced adhesion between the metal and dielectric at a particular level of an integrated circuit. Accordingly, because it is desired to use FSG as an interlayer dielectric, it is necessary to passivate unbonded fluorine, hydrogen and other contaminants that can degrade the adhesion of dielectric and metal prior to the deposition of metal over the dielectric.

Certain techniques have been attempted to curb the ill effects of fluorine in the dielectric material. Such techniques included a thermal treatment of the FSG at elevated temperatures for a relatively short period of time, as well as a furnace anneal in a nitrogen ambient and subsequently an exposure to nitrogen plasma for a short period of time. While heating the wafer at higher temperatures may foster the out-gasing of absorbed water and other materials from the films, it does nothing to passivate the unbonded fluorine or other impurities in the film. Furthermore, furnace annealing and plasma exposure of the film may not result in passivation through the entire thickness of the dielectric. Accordingly, underlying untreated FSG in the dielectric may still be exposed during subsequent planarization processing, even though regions close to the top surface of a FSG may have been appropriately passivated. Accordingly, annealing or treating of the surface of the dielectric is not a viable solution because of potential drawbacks in passivation and/or passivation completeness. While high-density plasma chemical vapor deposition (HDP-CVD) has been used in the deposition of fluorine doped silicon dioxide, the resulting surface is very unstable. Fluorine may react on the surface of the wafer, and in particular, issues of the exposure of the surface to moisture and atmosphere, are particularly problematic.

Accordingly, what is needed is a structure for reducing line-to-line capacitance and its method of manufacture that overcomes the above-captioned shortcomings of the prior art.

SUMMARY OF THE INVENTION

The present invention relates to a cap or barrier layer that can prevent the migration of impurities in low dielectric constant material, thereby preventing the impurities from attacking metal runners and traces in subsequent levels of a multi-level integrated circuit structure. The invention of the present disclosure is also drawn to a technique for fabricating the integrated circuit by disposing the diffusion-preventing barrier layer between a first dielectric layer and a metal layer at an upper level of the integrated circuit. The diffusion preventing barrier layer may be formed in-situ over the impurity containing dielectric material with the subsequent disposition of a metal layer thereover, and further processing of a multi-layer dielectric structure to include polishing. The in-situ deposition of the cap or barrier layer prevents the exposure of the impurity containing layer to atmosphere, thereby avoiding contamination of the layer by moisture absorption, hydrogen absorption, or the like. In an exemplary embodiment, the diffusion preventing barrier layer is a material containing silicon oxide or silicon rich silicon oxide $SiO_x$, where x is preferably less than 2). The impurity containing dielectric material may be fluorosilicate glass (FSG).

BRIEF DESCRIPTION OF THE DRAWINGS

The invention is best understood from the following detailed description when read with the accompanying drawing figures. It is emphasized that, in accordance with common practice in the semiconductor industry, the various features are not necessarily to scale. In fact, the dimensions of the various features may be arbitrarily increased or reduced for clarity of discussion.

DETAILED DESCRIPTION OF THE INVENTION

Figure 1:
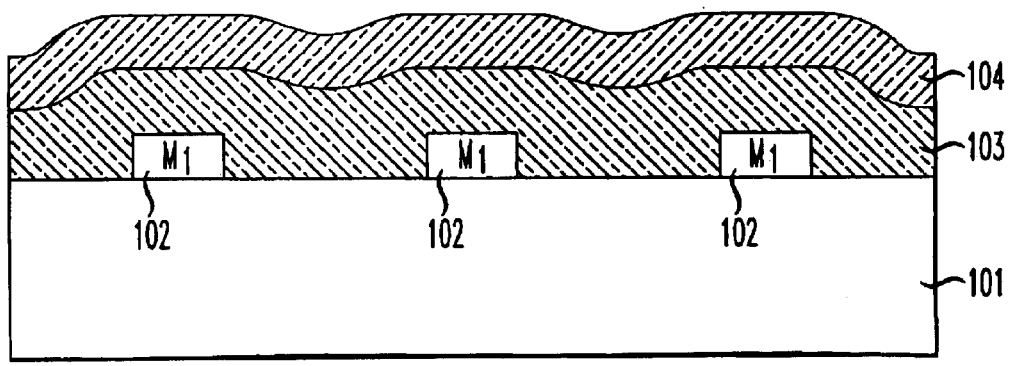
FIGS. 1–3 are cross-sectional views showing the processing sequence of an exemplary embodiment of the present invention.
Figure 2:
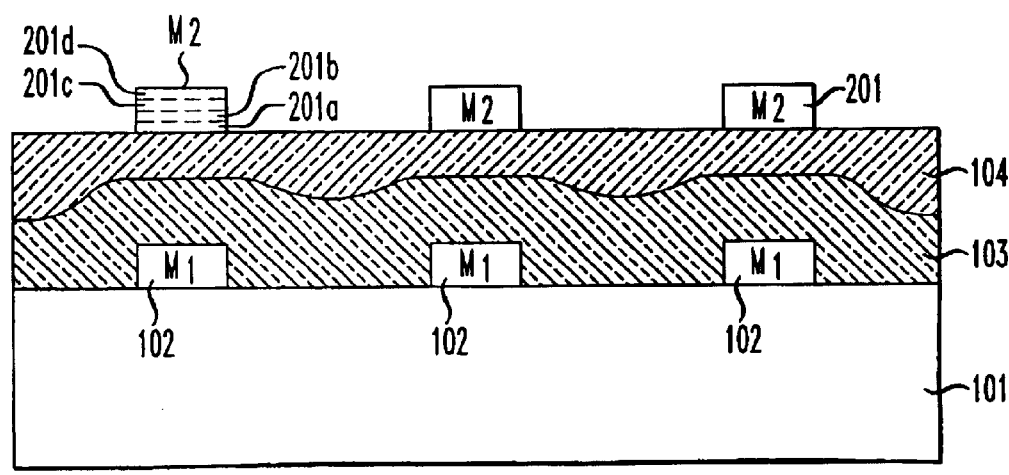
Figure 3:
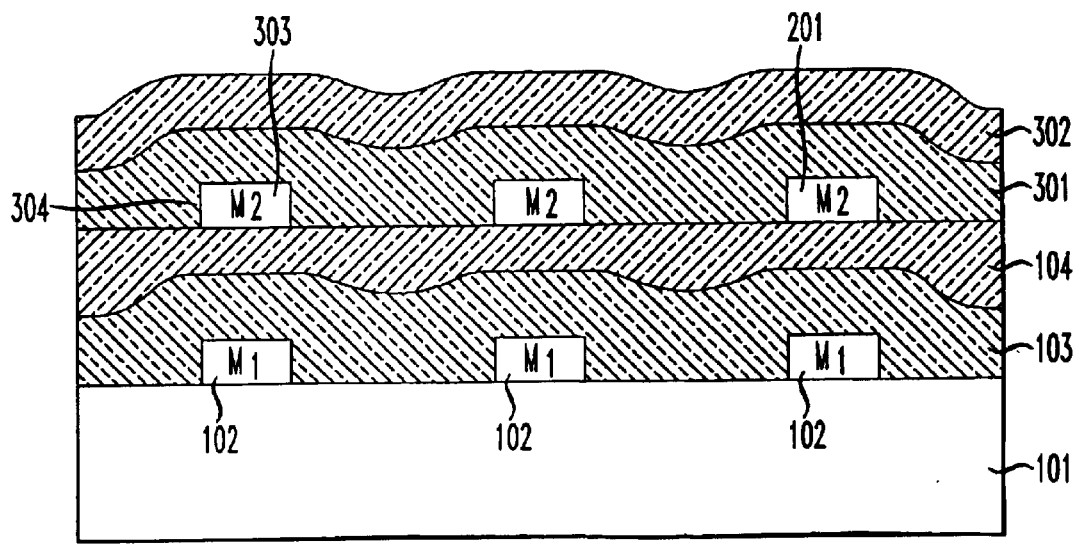

The present invention may be understood most generally from a review of FIGS. 1–3. FIG. 3 is a cross-sectional view of an exemplary embodiment of the invention of the present disclosure showing first and second levels of a multi-layer integrated circuit. A substrate 101 has a first level of conductive elements 102. These conductive elements are illustratively metal runners in the integrated circuit. Thereafter, the low-k dielectric material layer 103 is disposed over the conductive element 102, preferably by high-density plasma chemical vapor deposition (HDP-CVD). In the exemplary embodiment, the layer 103 may be fluorosilicate glass. Following the deposition of the low-k layer, a barrier or cap layer 104 (also referred to herein as an impurity preventing barrier layer) is formed. The barrier or cap layer 104 may include silicon oxide or silicon rich glass (SRG) or silicon rich silicon oxide $SiO_x$, where x is preferably less than 2. The barrier or cap layer 104 is deposited in-situ by a standard deposition technique with sufficient thickness so that a suitable thickness remains to protect both the low-k layer and the conductive elements after a standard planarization step is carried out. In particular, and as is explained in more detail herein, the layer 104 acts as a barrier layer to the migration of impurities from the low-k material 103 as a layer to protect the low-k layer from moisture/exposure to atmosphere. After planarization, as is shown in FIG. 2, metal layer $M_2$, 201 is disposed on the barrier layer. The process sequence continues as is shown with the HDP-CVD deposition of a second layer of low-k dielectric material 301 and the in-situ deposition of another cap or barrier layer 302. The metal layers 102, 201 are preferably a stack of Ti/TiN/AlCu/TiN (e.g., layers 201a, 201b, 201c, and 201d, respectively). Of the materials in the stack, the fluorine from the fluorosilicate glass of the exemplary embodiment reacts most readily with titanium. Accordingly, a major challenge is to prevent fluorine from attacking the titanium at the bottom of the stack, shown for example at 303. The barrier or cap layer is deposited between the layer of fluorosilicate glass 103 and the metal runners 201 to prevent the diffusion of fluorine to the bottom surface of metal 2 ($M_2$) 303. In particular, in the exemplary embodiment the bottom surface 303 of the metal runners 201 has an appreciable surface area, and therefore is more susceptible to corrosion from fluorine. Thus, layer 104 serves as the barrier layer, protecting the bottom surface 303. In contrast, in the exemplary embodiment, the side surface area 304 of the Ti layer is relatively negligible, and does not require a protective layer. However, it is within the purview of the present invention to dispose a protective layer to protect the side surface as well as the top surface (this protective layer to protect the side and top surface is not shown in the drawing figures). This is of particular interest if the side surface area of the runners 201 is increased appreciably.

Turning to FIG. 1, the substrate 101, which may be a semiconductor such as silicon, GaAs, SiGe or a dielectric material, has at least one conductive element 102 deposited thereon by standard technique. While the conductive elements 102 are metal runners used for interconnection in the exemplary embodiment, it is clear that the invention of the present disclosure can be used in a variety of applications to prevent the degradation of various and sundry types of conductive layers including, for example, bond pads, wire bond pads and plugs, which employ a variety of materials. Thereafter, the dielectric layer 103 is deposited by high-density plasma chemical vapor deposition (HDP-CVD); although other suitable techniques for deposition of the low-k dielectric layer are possible. In the exemplary embodiment layer 103 is a fluorine doped oxide layer illustratively fluorosilicate glass, SiOF. This layer is deposited in a thickness of on the order of 600 nm. The exemplary characteristics of this layer are 4–5% fluorine doping level; a dielectric constant of approximately 3.6–3.7; a refractive index 1.42–1.43; and a compressive stress of about 70 Mpa.

Following the deposition of layer 103, the protective cap or barrier layer 104 is deposited. In the exemplary embodiment of the present disclosure, the deposition of the cap layer 104 is done in-situ; wherein layer 103 and layer 104 may be deposited in the same apparatus. Accordingly, through the in-situ deposition of the barrier or cap layer, exposure of the fluorine doped silicon dioxide film to atmosphere may be avoided, and issues including hydrogen absorption, moisture absorption by layer 103 and contamination of layer 103 discussed above may be avoided. In particular, after deposition of layer 103, in the exemplary embodiment FSG, $SiH_4$ and $SiF_4$ gases used in the HDP-CVD deposition of the FSG are pumped out of the chamber. The bias radio frequency (BRF power) used in the HDP-CVD deposition of the FSG, is gradually reduced and finally switched off. Helium, which is used in the HDP-CVD process as a cooling gas to maintain wafer temperature during deposition is thereafter pumped out, and the plasma is extinguished. At this point, the wafer is dechucked and could be unloaded. However, instead of unloading, the wafer remains in the chamber under vacuum for approximately 150 seconds in a wait step. This wait step enables sufficient time for wafer's temperature to decrease to approximately the ambient temperature of the chamber, which is normally below 200° C. Following this step, plasma is generated a second time and a source-only heat-up step is performed to warm up the wafer. Other standard techniques used in plasma chemical vapor deposition are used to chuck the wafer, start the cooling, and initiate the deposition of an undoped silicon dioxide film (USG). The barrier or cap layer 103 (in the illustrative embodiment a silicon-rich silicon dioxide film) is then deposited. This film is exemplary $SiO_x$, where x is <2, and is referenced as HDP-SRC or HDP-SRG in the present application. This layer is shown at 104 in FIG. 1. This film has a thickness on the order of approximately 200 nm, and characteristically has a higher refractive index (on the order of 1.48 or greater) than silicon dioxide films (on the order of 1.46). A higher flow rate of $SiH_4$ over $O_2$ during the HDP-CVD deposition of the oxide results in the silicon rich layer. In an exemplary embodiment, the flow ratio of $SiH_4$ over $O_2$ is 0.75. The silicon rich cap layer is preferably deposited using decoupled source plasma sustained by top and side coil RF driven sources. Finally, because the deposition of the silicon rich cap layer is carried out without a break in vacuum, moisture uptake and subsequent contamination of the FSG layer is specifically avoided.

By virtue of the in-situ deposition technique described above, in the exemplary embodiment in which the layer 104 is silicon-rich oxide, the underlying FSG layer is passivated. It is theorized that silicon dangling bonds in the silicon rich oxide act as positively charged electron traps, readily passivated by fluorine atoms. Accordingly, the fluorine does not penetrate throughout the layer 104, and thus does not attack subsequently disposed metallization. Additionally, by virtue of the silicon-rich oxide film and its in-situ deposition, moisture permeation is also avoided. To this end, fluorine doped dielectric films are prone to moisture absorption and contamination in general, as discussed above. Accordingly, contaminants in the atmosphere, to include hydrogen, which can out-gas resulting in delamination and other adhesion problems between a metal layer and a dielectric layer may be avoided by using the silicon rich glass, as well as during processing by the in-situ deposition thereof.

After the deposition of layer 104, a standard cap layer (not shown), which is not a silicon rich oxide, may be deposited using a standard non-gap-fill technique such as plasma enhanced tetraethylorthosilane chemical vapor deposition (PE-TEOS CVD), which is compatible with standard via etch and chemical mechanical polishing (CMP) routings. The thickness of this layer is of the order of 150 nm. Following this, a standard planarization step is performed, using, for example, chemical mechanical polishing, and results in a substantially planar top surface. It is of importance to note that the barrier or cap layer 104 is believed to prevent contamination of the layer 103 by chemicals used in CMP for reasons similar to those stated above. Thereafter, metallization 201 is deposited by standard techniques. The deposition of FSG is carried out by a technique identical to that discussed here and above resulting in layer 301 being deposited over the metallization at level 2 ($M_2$). Thereafter, the in-situ deposition of a silicon cap layer 302 is carried out, followed by PE-TEOS CVD and subsequent planarization consistent with that discussed above is carried out. As can be appreciated, multi-layer integrated circuits can be fabricated by the invention of the present disclosure.

The invention having been described in detail, it is clear that there are variations and modifications readily apparent to one of ordinary skill in the art. To the extent that such variations and modifications of the barrier disclosure of a low-k material with a protective layer to avoid degradation of conductive elements and to protect the low-k material from exposure to atmosphere is within the purview of the ordinary skilled person having had the benefit of the present disclosure, such are deemed within the scope of the present invention.

What is claimed:

1. An integrated circuit, comprising:
    a substrate having at least one first conductive element disposed thereon;
    an impurity containing dielectric layer of fluorosilicate glass disposed over and contacting said substrate and said first conductive element;
    an impurity preventing barrier layer disposed over and contacting said impurity containing dielectric layer, wherein said impurity preventing barrier layer includes a silicon rich oxide; and
    at least one second conductive element disposed over said impurity preventing barrier layer having at least one surface of said second conductive element contacting said impurity preventing barrier layer.

2. An integrated circuit as recited in claim 1, wherein said impurity containing dielectric layer is a low-k dielectric material.

3. An integrated circuit as recited in claim 1, wherein said impurity preventing barrier layer is disposed in-situ.

4. An integrated circuit as recited in claim 1 wherein said impurity containing dielectric layer contains unbonded or loosely-bonded fluorine radicals and ions.

5. An integrated circuit as recited in claim 1 wherein said at least one conductive element is titanium.

6. An integrated circuit, comprising:
    a substrate having at least one first conductive element disposed thereon;
    a fluorine doped oxide layer disposed over and contacting said substrate and said first conductive element;
    an impurity preventing silicon rich oxide barrier layer disposed over and contacting said fluorine doped oxide layer; and
    at least one second conductive element disposed over said impurity preventing silicon rich oxide barrier layer having at least one surface of said second conductive element contacting said impurity preventing silicon rich oxide barrier layer.

7. An integrated circuit as recited in claim 6, wherein said fluorine doped oxide layer is fluorosilicate glass (FSG).

8. An integrated circuit as recited in claim 6, wherein said at least one second conductive element contains metal.

9. An integrated circuit as recited in claim 6, wherein said at least one second conductive element further comprises a stack of at least two layers and a bottom layer of said stack is Ti.

10. An integrated circuit as recited in claim 6, wherein said impurity preventing barrier layer is $SiO_x$, where x<2.

11. An integrated circuit as recited in claim 6, wherein said fluorine doped oxide layer is a low-k material.

12. An integrated circuit as recited in claim 6 wherein said fluorine doped oxide layer contains unbonded or loosely-bonded fluorine radicals and ions.

13. An integrated circuit as recited in claim 6 wherein said at least one conductive element is titanium.

* * * * *